United States Patent
Daga et al.

(10) Patent No.: US 11,556,406 B2
(45) Date of Patent: Jan. 17, 2023

(54) AUTOMATIC ROOT CAUSE ANALYSIS OF COMPLEX STATIC VIOLATIONS BY STATIC INFORMATION REPOSITORY EXPLORATION

(71) Applicant: Synopsys, Inc., Mountain View, CA (US)

(72) Inventors: Aditya Daga, Bengaluru (IN); Sauresh Bhowmick, Bengaluru (IN); Bhaskar Pal, Bengaluru (IN); Rajarshi Mukherjee, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 474 days.

(21) Appl. No.: 16/700,869

(22) Filed: Dec. 2, 2019

(65) Prior Publication Data
US 2020/0174871 A1    Jun. 4, 2020

(30) Foreign Application Priority Data

Dec. 3, 2018 (IN) .............................. 201811045495

(51) Int. Cl.
   G06F 11/07      (2006.01)
   G05B 23/02      (2006.01)
   H04L 41/0631    (2022.01)
   G06F 30/3323    (2020.01)

(52) U.S. Cl.
   CPC ........ G06F 11/079 (2013.01); G05B 23/0248 (2013.01); G05B 23/0281 (2013.01); G06F 30/3323 (2020.01); H04L 41/0636 (2013.01)

(58) Field of Classification Search
   CPC ... G06F 11/79; G06F 30/3323; G05B 23/248; G05B 23/281; H04L 41/0636

USPC ......................................................... 703/110
See application file for complete search history.

(56) References Cited

U.S. PATENT DOCUMENTS

| 4,922,432 A | 5/1990 | Kobayashi et al. |
| 8,516,418 B2 * | 8/2013 | Singh ..................... G06F 30/30 716/54 |
| 8,667,455 B1 * | 3/2014 | Ho .......................... G06F 30/39 716/139 |
| 9,305,133 B1 | 4/2016 | Ghosh et al. |

(Continued)

FOREIGN PATENT DOCUMENTS

WO   WO-2005043553 A1 *  5/2005  ........... G01R 31/027

OTHER PUBLICATIONS

Kerr_2017 (VC-LP: Not Just for Chips! 2017 (Year: 2017).*

(Continued)

*Primary Examiner* — Brian S Cook
(74) *Attorney, Agent, or Firm* — Weaver Austin Villeneuve & Sampson LLP

(57) ABSTRACT

The independent claims of this patent signify a concise description of embodiments. An automatic process for determining and/or predicting the original root-cause(s) of a violation is proposed using two major enhancements on top of the current VC-Static solution. First, an information repository is created by mining various Static checker components' analysis information, and second, an analysis framework is created which systematically prunes the above-mentioned information repository to find the actual root cause(s) of the violation. This Abstract is not intended to limit the scope of the claims.

20 Claims, 12 Drawing Sheets

(56) References Cited

U.S. PATENT DOCUMENTS 9,792,397 B1 10/2017 Nagaraja
2015/0355274 A1* 12/2015 Ross .................... G01R 31/311
324/754.23

OTHER PUBLICATIONS

Burleson_2015 (Oracle Partitioning Pruning Tips, May 14, 2015). (Year: 2015).*
SQL_2018 (Query Processing Order Apr. 12, 2018). (Year: 2018).*

* cited by examiner

| Tree Summary | | | |
|---|---|---|---|
| Severity | Stage | Tag | Count |
| error | UPF | ISO_STRATEGY_MISSING | 1 |
| error | UPF | UPF_BIAS_MISSING | 6 |
| warning | UPF | PSW_STRATEGY_CTRL_UNCONN | 1 |
| warning | UPF | UPF_CSN_PSW | 1 |
| warning | UPF | UPF_PORT_UNCONSTRAINED | 9 |
| Total | | | 18 |

| elements | | policy | power_domain | filename | line_no |
|---|---|---|---|---|---|
| core2/out2 | no yes | iso2 | PD2 | top.upf | 12 |
| core4/out4 | yes no | iso3 | PD3 | top.upf | 26 | data mined from set_isolation commands

FIG. 4

| PAN | POLICY FOUND? | Source Supply Mismatch | Reason Code | Sink Supply Mismatch | Reason Code | diff_sup ply true? | Reason Code |
|---|---|---|---|---|---|---|---|
| core1/out1 | Yes | Yes | CSN_VDD applied | No | NA | No | NA |
| core3/out3 | Yes | No | NA | Yes | CSN_VDD3 applied (no fanout) | No | NA |

Xover node attributes knowledgebase

FIG. 5

| | Upf_command | filename | line_no |
|---|---|---|---|
| (core1/out1 , VDD1) | connect_supply_net | top1.upf | 19 |
| (core2/out2 , VDD) | connect_supply_net | top1.upf | 19 | parsed commands' data

FIG. 6

AUTOMATIC ROOT CAUSE ANALYSIS OF COMPLEX STATIC VIOLATIONS BY STATIC INFORMATION REPOSITORY EXPLORATION

CROSS-REFERENCE TO RELATED APPLICATIONS

This patent application claims priority to Indian Patent Appl. Ser. No. 201811045495, filed Dec. 3, 2018, which is incorporated herein by reference in its entirety.

COPYRIGHT NOTICE

The assignee of this patent document has no objection to the facsimile reproduction by anyone of the patent document itself or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

FIELD(S) OF TECHNOLOGY

This disclosure relates to the field of electronic design automation in general, including the following topics: Static verification of system-on-chip (SOC) designs and automated verification processes of the same.

BACKGROUND

VC-Static is a static verification tool for SOCs, available from Synopsys, Inc. of Mountain View, Calif., used to verify completeness and consistency of design at every implementation stage. Customers use it to verify their designs which range from small functional module to SOC level. VC-Static uses the design information along with other auxiliary information to verify those designs and produces several violations to pin-point the structural and consistency errors in the design. Each violation instance (in a violation report) states the type of problem present in the design along with structural information through multiple debug fields.

A subset of these debug fields is key in characterizing the violations. Others are used to provide other valuable information to manually identify a root cause of the problem. In most of the cases, the debug field values act as a starting point for a debug process, but very accurate root cause analysis requires significant manual analysis of the original design, additional inputs, and internal checker analysis information.

Methods exist to group a set of related violations which helps to speed up debug of huge number of violations. These techniques significantly speed up the initial debug of huge violations and help to identify a root cause of the lower or medium complexity issues.

Though a systematic manual analysis of a static violation with the help of static databases and auxiliary inputs (UPF/Design) can lead to the original root-cause(s) for a violation, manual analysis of such information is an arduous job considering its magnitude and complexity. However, there is no published technique which performs in-depth automatic root cause analysis of a very complex static violation scenario that can connect the violation with all its potential root-causes through systematic exploration of analysis information repository.

SUMMARY

The claims signify a brief description of one or more of the innovations, embodiments, and/or examples found within this disclosure.

The in-depth root cause analysis concepts discussed herein help designers to reduce debug time and costs significantly for very complex static bugs.

One embodiment is directed to an automatic process of solving the above-mentioned problem using two major enhancements on top of the static design solutions. First, a module creates an information repository by mining various static design checker components' analysis information. Second, a second module creates an analysis framework which systematically prunes the above-mentioned information repository to find and/or predict the actual root cause(s) of the violation.

This framework utilizes embedded domain knowledge-based intelligence to perform various aspects of root-cause analysis when provided with verbose information required for the analysis.

The above-mentioned root cause analysis framework may be utilized in a plurality of scenarios. As a first example, the above-mentioned framework may be utilized if the user wants to find the root cause(s) of a complex static violation. Second, if the user wants to find the root cause of a differential result generated from two different settings of the tool, certain embodiments of the above-mentioned framework are available.

Various embodiments are directed to a system for identifying a root cause of a static checker violation, the system comprising: a static information repository (SIR) configured for storing one or more databases in a hierarchical configuration comprising data relevant to a design violation; a root cause analysis framework (RCAF) configured to: receive a violation report relevant to the design violation, wherein the violation report comprises a plurality of debug field values within corresponding debug fields; query a domain knowledge database to identify one or more debug fields relevant to identify a root cause of the design violation; prune data of the hierarchical configuration of the SIR based at least in part on debug field values associated with the one or more identified debug fields; and identify a root cause of the design violation by querying the SIR based at least in part on debug field values associated with the one or more identified debug fields.

In various embodiments, the system is further configured to populate the SIR with data relevant to the design violation during generation of a low-power UPF violation. Moreover, pruning data of the hierarchical configuration of the SIR may comprise: querying each of a plurality of databases within the SIR to identify relevant data therein; and pruning one or more databases identified as not containing relevant information.

In certain embodiments, querying the SIR comprises querying a plurality of databases within the SIR in an order defined at least in part by data within the domain knowledge database.

In various embodiments, the RCAF is further configured to generate an output identifying a root cause of the design violation.

Moreover, pruning data of the hierarchical configuration may comprise: receiving user input identifying data for pruning; and pruning data identified within the user input.

Certain embodiments are directed to a computer-implemented method for identifying a root-cause of a static checker violation, the method comprising: populating a static information repository (SIR) embodied as a memory storage area with data relevant to a design violation, wherein the data is stored in hierarchical databases within the SIR; receiving a violation report relevant to a design violation, wherein the violation report comprises a plurality of debug field values within corresponding debug fields; querying a domain knowledge database to identify one or more debug fields relevant to identify a root cause of the design violation; pruning data of the hierarchical configuration of the SIR based at least in part on debug field values associated with the one or more identified debug fields; and identifying a root cause of the design violation by querying the SIR based at least in part on debug field values associated with the one or more identified debug fields.

In certain embodiments, pruning data of the hierarchical configuration of the SIR comprises: querying each of a plurality of databases within the SIR to identify relevant data therein; and pruning one or more databases identified as not containing relevant information.

In various embodiments, querying the SIR comprises querying a plurality of databases within the SIR in an order defined at least in part by data within the domain knowledge database.

In certain embodiments, the method further comprises generating an output identifying a root cause of the design violation. In various embodiments, pruning data of the hierarchical configuration comprises: receiving user input identifying data for pruning; and pruning data identified within the user input.

Various embodiments are directed to a non-transitory computer-readable storage medium comprising executable instructions configured to, when executed by a processor, cause the processor to: populate a static information repository (SIR) embodied as a memory storage area with data relevant to a design violation, wherein the data is stored in hierarchical databases within the SIR; receive a violation report relevant to a design violation, wherein the violation report comprises a plurality of debug field values within corresponding debug fields; query a domain knowledge database to identify one or more debug fields relevant to identify a root cause of the design violation; prune data of the hierarchical configuration of the SIR based at least in part on debug field values associated with the one or more identified debug fields; and identify a root cause of the design violation by querying the SIR based at least in part on debug field values associated with the one or more identified debug fields.

In certain embodiments, pruning data of the hierarchical configuration of the SIR comprises: querying each of a plurality of databases within the SIR to identify relevant data therein; and pruning one or more databases identified as not containing relevant information.

In various embodiments, querying the SIR comprises querying a plurality of databases within the SIR in an order defined at least in part by data within the domain knowledge database.

Moreover, certain embodiments further comprise executable instructions configured to, when executed by a processor, cause the processor to generate an output identifying a root cause of the design violation.

In various embodiments, pruning data of the hierarchical configuration comprises: receiving user input identifying data for pruning; and pruning data identified within the user input.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 2 shows a typical VCLP violation report.

FIG. 3 illustrates shows by a detailed description of a violation within a VCLP violation report.

FIG. 4 illustrates the SIR, a collection of mined information collected in the form of a tabular data during different stages of design analysis.

FIG. 5 illustrates that the attributes of each Xover node can be captured in a tabular data repository during power intent analysis.

FIG. 6 illustrates a parser containing information of various low power commands.

Figure 1:
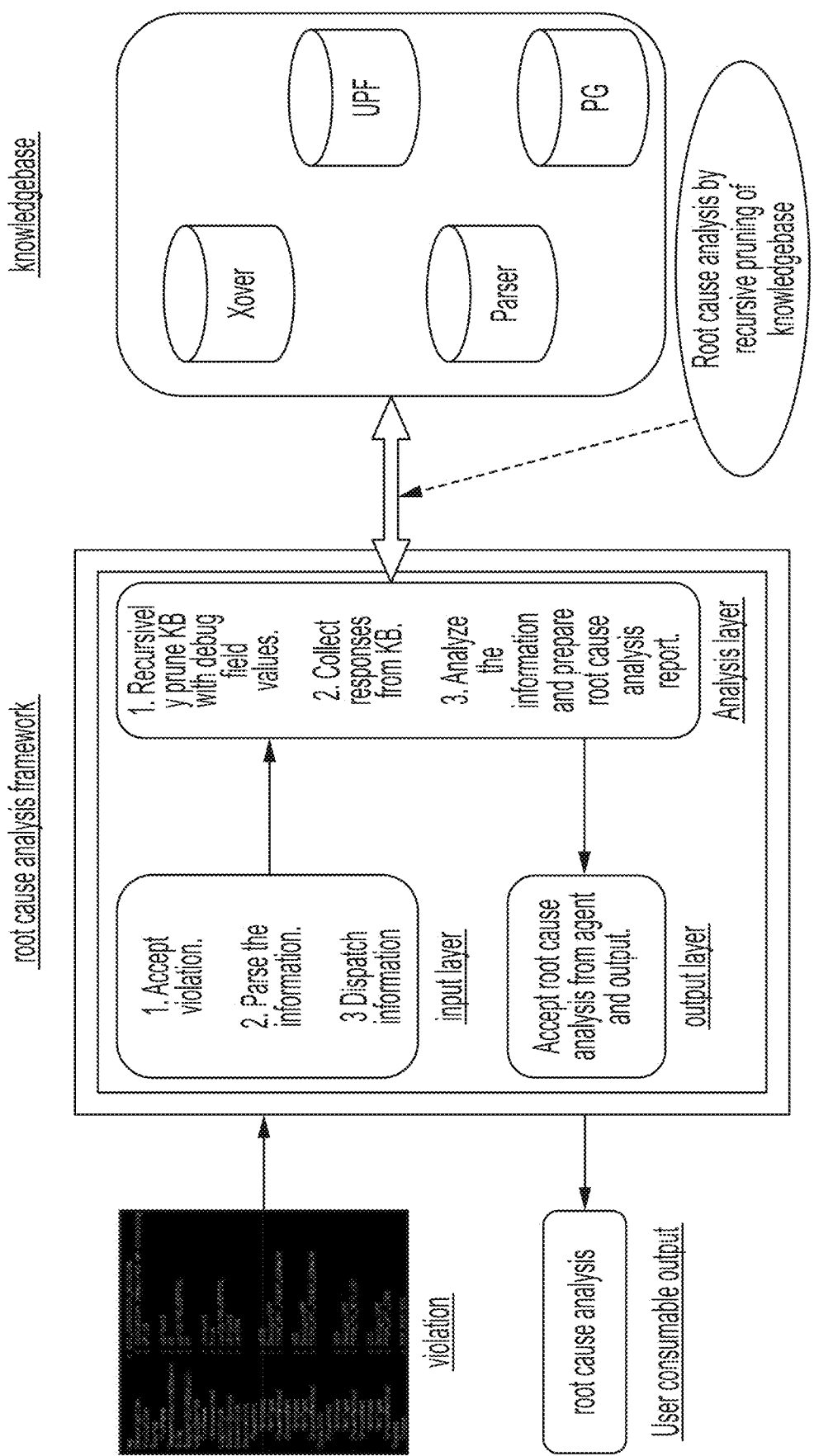
FIG. 1 illustrates the overall flow of the entire framework in accordance with an embodiment.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Manually debugging a complex static checker takes time and hits the verification convergence schedule of almost every customer trying to verify a complex design. Therefore, a good debug solution for complex static issues is necessary.

The presently described solution comprises two modules:
1. A Static Information Repository (SIR), created by mining various static checker components' analysis information. The root-cause framework explores this information repository to find and/or predict the actual root-cause(s) of the violation.
2. A Root Cause Analysis Framework (RCAF) configured to systematically prune data of the SIR to find and/or predict the actual root-cause(s) for a violation. RCAF has domain knowledge based intelligence embedded therein to perform a root-cause analysis, when provided with all the verbose information required (e.g., via information repository) for the analysis.

The overall flow of the entire framework is illustrated in FIG. 1.

In the following sections, the work flow of the Root Cause Analysis Framework is analyzed by citing examples from a VC-Static tool called VC-Low Power (VCLP). However, it should be understood that the same flow can be applied to other static design tools, such as the non-limiting examples of VC-CDC, VC-Lint, and/or the like for root-causing their respective violations.

'Static Information Repository' (SIR) Creation

Figure 3:
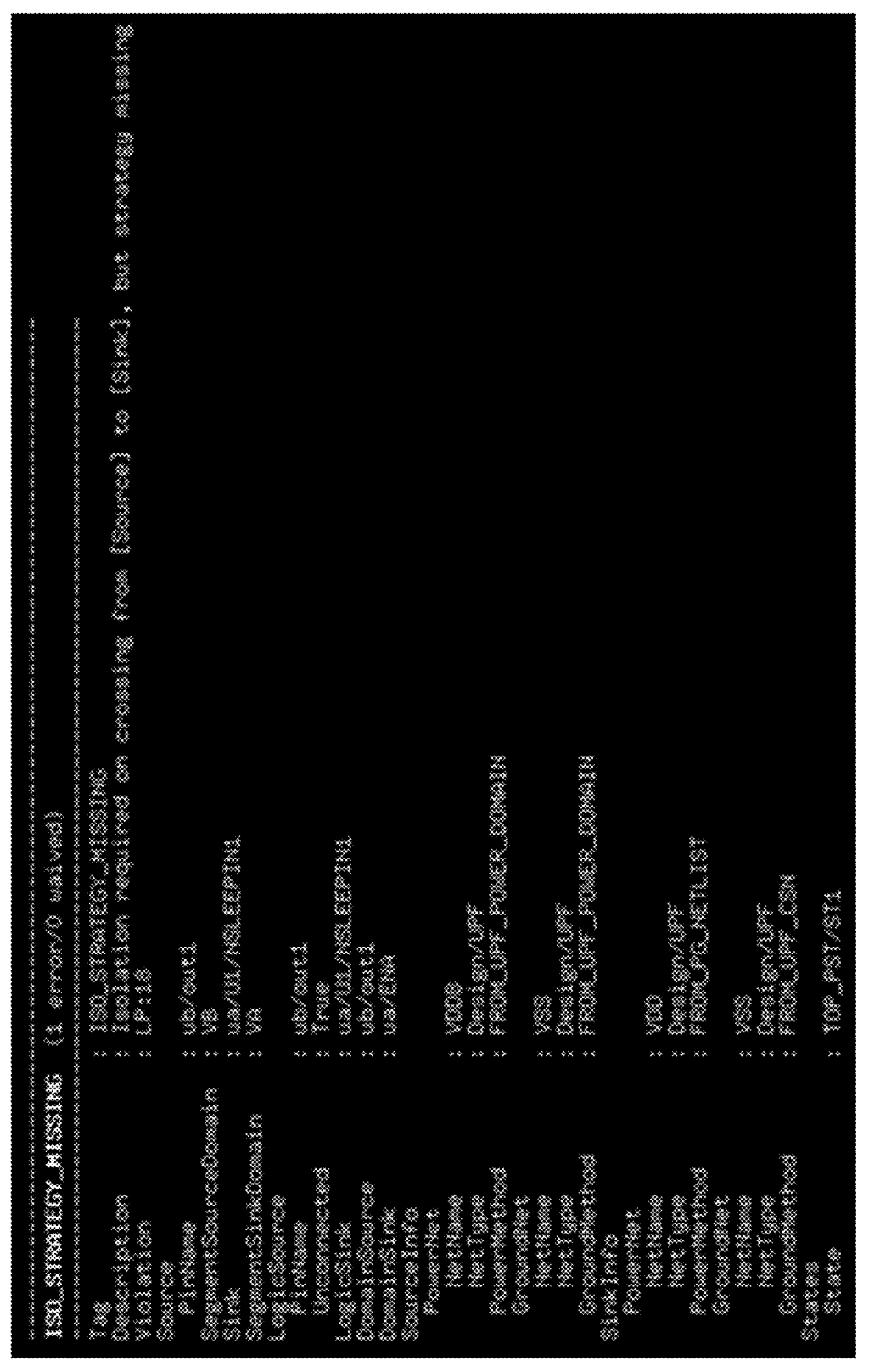

VCLP is a static low power verification tool which uses UPF (along with design information) to verify completeness and consistency of power intent and netlist at every implementation stage. Static low power verification tools may be divided into various components, such as Adapter, Xover, Power-Network, PG, and/or the like; each of them configured to compute a different aspect of low power intent. Some aspects of the low power intent is also captured in the design and UPF as well. Combined, these components and auxiliary inputs (Design/UPF) help to identify various kinds of static problems in the design. As generated by certain static low power verification tools, only some of this debug information is listed in the form of a violation report. A typical VCLP violation report contains a summary of violations as shown in FIG. 2, followed by a detailed description of each violation as shown in FIG. 3.

Though a systematic (e.g., domain-knowledge driven) manual debug of a static violation with the help of low power databases and auxiliary inputs (UPF/Design) can lead to the identification of original root-cause(s) for a violation, manual analysis of the low power databases and auxiliary inputs becomes a very arduous job for the user considering the magnitude and complexity of such information. Accordingly, certain embodiments provide guided computer processes apt for such systematic exploration while addressing such large volume and complexity of the data.

A systematic development and query of various low power analysis and auxiliary inputs can lead to the identification and/or prediction of the root-cause of a complex violation. But current data-model based methods of storing analysis information may not facilitate this functionality. An automated query-based infrastructure, such as enabled when using an SIR as discussed herein, created out of the low power database provides a solution facilitating automated root-cause analysis of complex violations.

The SIR comprises a collection of mined information collected in the form of a tabular data during different stages of design analysis. Data within the SIR may be stored temporarily during a design and/or debug process within a non-transitory memory storage area. Moreover, the data stored therein may be additive in nature, such that data may be generated at temporally disparate instances and stored within a combined SIR for a particular design. For example, during parsing the UPF, the file name, line number and/or different command options of each UPF commands may be identified and stored within the SIR. In certain embodiments, the SIR comprises one or more hierarchical databases, each corresponding to a different aspect of the UPF design and each comprising data generated by a different one of a plurality of design tools. Each design tool may execute one or more diagnosis processes, each of which generate data output that is captured and stored within relevant nodes of the SIR. As discussed in greater detail herein, the one or more hierarchical databases may correspond to debug fields generated as a part of a violation report, thereby enabling tracing of violations identified with specific debug fields into hierarchical databases of the SIR.

Figure 9:
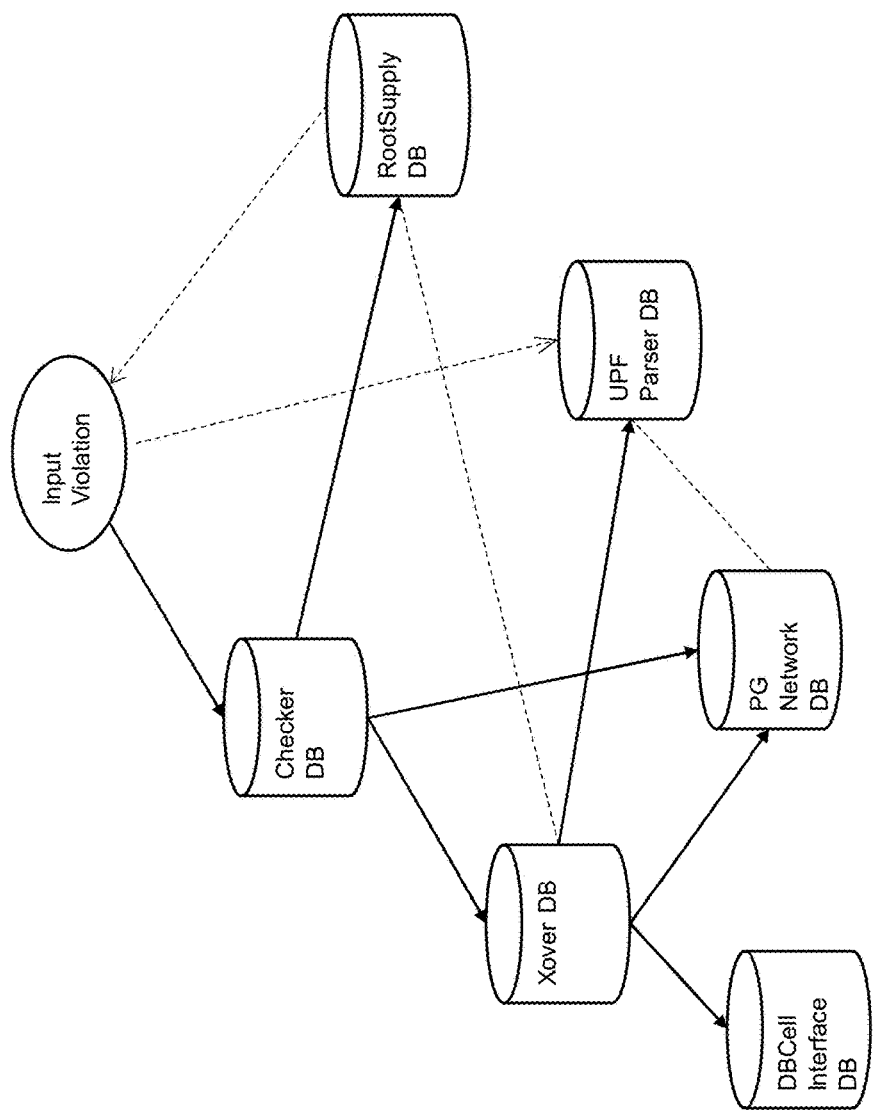
FIGS. 9-11 illustrate hierarchical structures of an SIR according to one embodiment.

For example, FIG. 9 illustrates an example structure of an SIR for a given input violation according to one embodiment. As shown therein, the SIR may comprise a plurality of interconnected databases each corresponding to output of a different tool. As illustrated, the various databases of the SIR may be interconnected via edges having a strength designation determined based at least in part on data stored within the domain knowledge database. The strength of edges between various databases of the SIR may be dependent at least in part on the given input violation, as data stored within various databases of the SIR may have different levels of relevance for determining a root cause based at least in part on the input violation. As shown, edges may thus be defined as "strong" edges or "weak" edges, as defined based at least in part on the domain knowledge. In certain embodiments, the strength of edges between databases within the SIR may be utilized to determine data to be pruned within the SIR for determining a root cause. Strong edges may be indicative of edges likely to lead to an identification and/or prediction of a root cause, while weak edges may be indicative of edges that are not likely to lead to an identification and/or prediction of a root cause, and therefore databases connected via weak edges may be pruned to facilitate further analysis. In the illustrated embodiment of FIG. 9, the SIR comprises a Checker database, a RootSupply database, a Xover database, a UPF parser database, a PG Network database, and a DBCell Interface database. As discussed in later detail herein, such databases may be individually queried in accordance with instructions provided within a domain knowledge database and/or based on results of a prior query of other databases within the SIR. Moreover, various databases may be pruned during analysis to identify and/or predict a root cause of a violation.

For set_isolation command, the information can be stored in a manner shown in FIG. 4. Other data, such as data generated during execution of various subcomponents (e.g., design tools) of the UPF may be generated separately and stored within the SIR together with appropriate metadata indicative of the identity and/or relevance of the stored data. In certain embodiments, data within the SIR may be stored in any of a variety of data storage formats so as to facilitate querying and/or pruning thereof during root cause analysis as discussed herein. In certain embodiments, the SIR comprises a plurality of nodes each comprising separate data, such as data generated during temporally discrete instances. As just one example, FIG. 5 illustrates attributes of each Xover node, which may be captured and stored in the following tabular data repository during power intent analysis.

A parser containing information of various low power commands is shown in FIG. 6. In addition to what is available in the checker, metadata is also augmented to SIR to give more contextual information to the user. Thus, each checker component will produce one or more information repositories to aid the root cause analysis framework (RCAF).

Root-Cause Analysis Framework

Currently, users manually debug the root-cause of a violation (as reflected in FIG. 2) as follows,
1. Pick a debug field value to start with.
2. Manually try to debug the issue with the help of the dumps from various tool components (parser, adapter, Xover etc.) and use that information to find the root-cause.
3. If the root-cause is identified, then the debugging effort is completed. Otherwise, the user picks another debug field and repeats the same process mentioned above until root cause is found.

The above-mentioned process of root cause analysis method suffers many efficiency issues such as:
1. The priority order in which the debug fields should be explored is domain knowledge driven, and may be reflected by the experience of a particular user. Users lacking sufficient domain knowledge may be challenged to identify a root cause without substantial iterations through a debug process.
2. Analyzing data generated by one or more data tools requires analysis of large amounts of data encompassing an arduous task for a user. For larger designs, the sheer quantity of data generated is nearly impossible for user consumption.
3. This shear quantity of generated data often leads to inaccurate root cause analysis and requires the user to repeatedly reinitiate a search for accurate root causes.
4. Inter-relationships between various design elements (e.g., debug field values) cannot be easily identified manually from the generated data, and a more insightful view into the design is required to identify such inter-relationships.
5. A user's actions (or series of actions) during a root cause analysis is not captured during manual processing for utilization to facilitate future analyses.

A Static Information Repository (SIR, described above) can be used to solve various of the above-mentioned issues.

For solving problem 1, a new analysis framework is introduced that attempts to mimic the methodology a domain expert would adopt to solve the problem, called Root Cause Analysis Framework (RCAF). In certain embodiments, the RCAF comprises a domain knowledge database comprising encoded interrelationships between various design characteristics that may be reflected within a design. Such data provides a high degree of domain knowledge that may be quickly queried and utilized for analyzing design violations via an automated process, such as via querying one or more databases of an SIR as discussed herein. The generic workflow of an embodiment of the RCAF is provided.

In certain embodiments, one or more designs may generate a plurality of violations, each having/generating corresponding SIR databases. In such embodiments, the RCAF may be configured to initiate and/or to determine an appropriate strategy for identifying one or more root causes for the plurality of violations upon determining that there is a difference between SIRs corresponding to each of the violations. As a specific example, a design may be run, which may result in generation of a first violation (having a corresponding first SIR), the design may be run again, which may result in generation of a second violation (having a corresponding second SIR). The RCAF may identify differences between the first SIR and second SIR, and upon detecting a one or more differences, may execute methodologies as discussed herein for identifying and/or predicting one or more root causes of the violations (e.g., at least in part by querying each of the first and the second SIRs).

Upon receipt of one or more violations for a UPF design, the RCAF (e.g., via the analysis layer) determines an appropriate priority order for which to analyze debug fields included within a violation report received via an input layer. The priority order may be determined in certain embodiments by the RCAF, at least in part, by querying the domain knowledge database in light of metadata included with the violation report. The metadata included within the violation report may be compared against corresponding indications of metadata within the domain knowledge database to identify one or more debug fields most likely to yield accurate information regarding a root cause of a violation. In this regard, the domain knowledge database may be populated by static data (e.g., provided manually and/or otherwise during a database setup procedure) that links metadata (or known combinations thereof) with a recommended priority order. However, it should be understood that the domain knowledge database may be updated periodically and/or continuously as additional violations are analyzed. In such embodiments, the domain knowledge database may be populated based at least in part on the results of machine-learning modelling of a historical dataset identifying the root cause of various violations.

Figure 10:
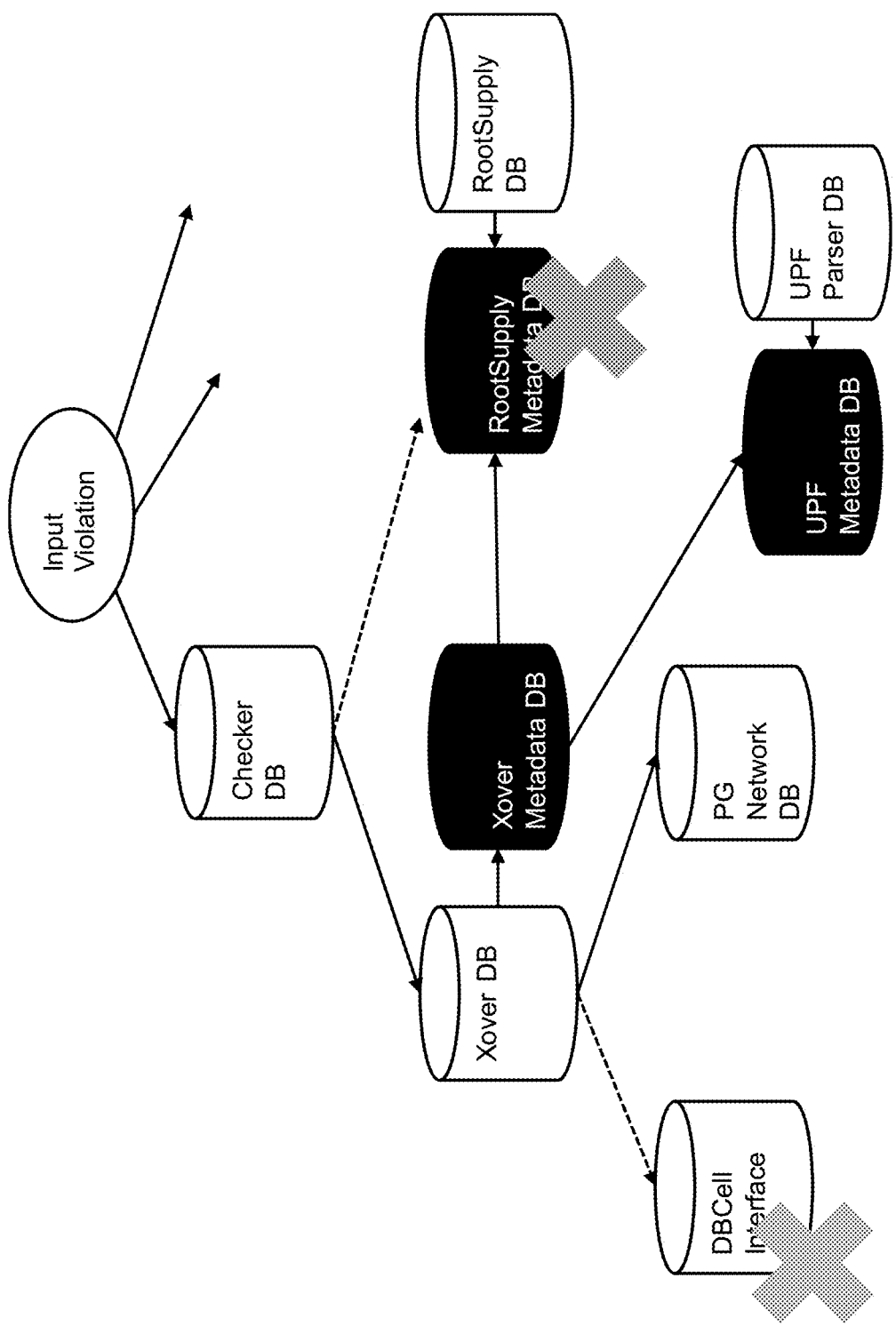
Figure 11:
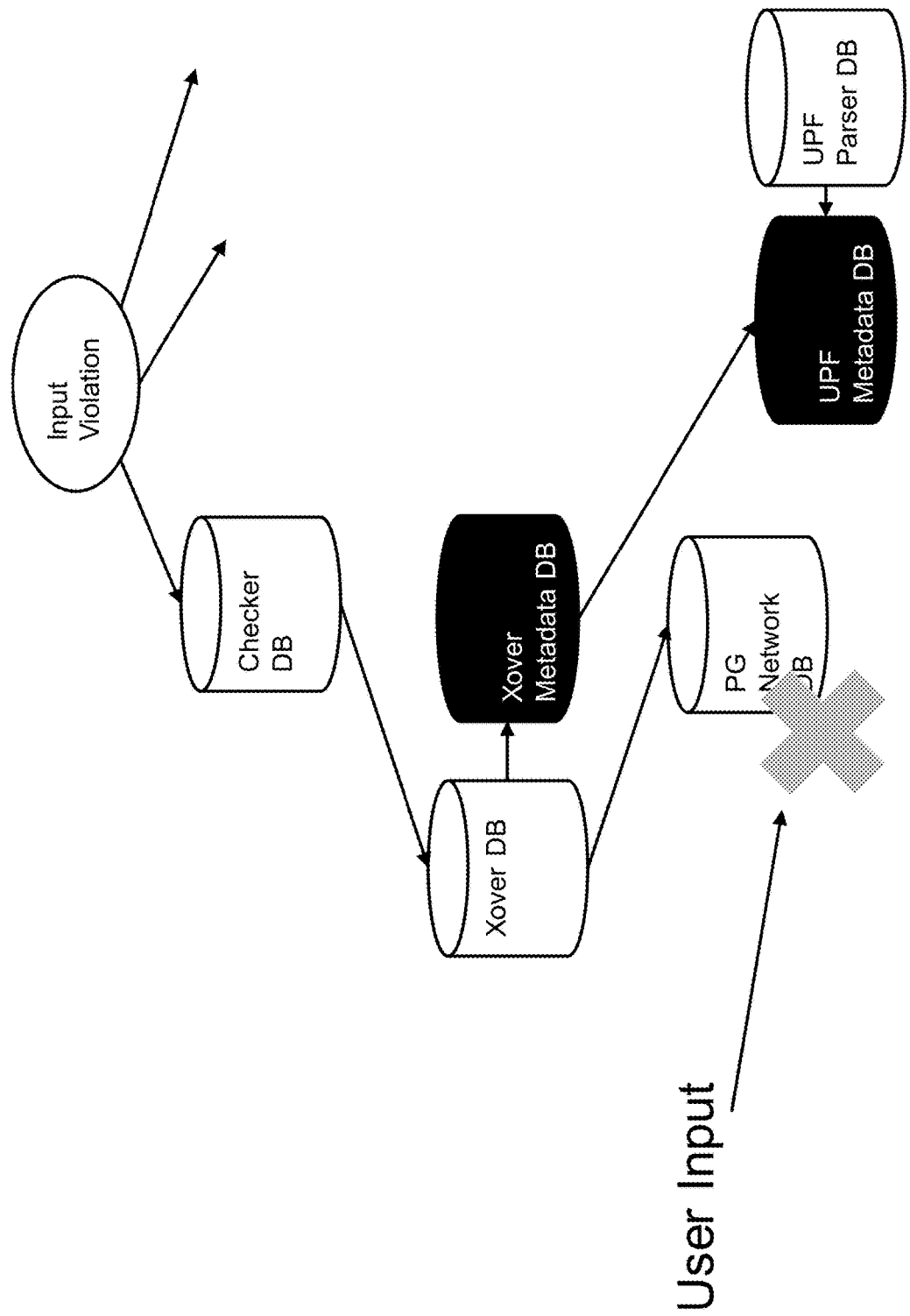

The debug field values (debug field values are provided as a 'string') included with the violation report are analyzed via the analysis layer in the priority order determined by the RCAF. For each debug field value (e.g., 'dvalue'), the RCAF searches the SIR to find entries against the provided search value (e.g., 'dvalue'). As noted, the SIR may be provided in a hierarchical form, and accordingly review of the SIR may comprise sequential review of each of a plurality of included databases, based on connections (edges) between data within each database. Each entry identified as relevant to the search value may additionally comprise data indicative of the role of that debug field value in causing the violation, or comprises data pointing to another debug field value, exploration of which is determined to be likely to lead to identification and/or prediction of the root cause of the violation. With reference to FIG. 10, illustrating an initial review of data within the SIR, and FIG. 11, illustrating a later step of analysis of data within the SIR, the analysis layer of the RCAF may be configured to prune other entries within the SIR from the analysis as irrelevant to facilitate the identification and/or prediction of the root cause of the violation using minimal computational resources. For example, databases within the SIR that are unassociated with data entries identified as relevant to particular debug field may be pruned from the analysis so as to facilitate analysis of relevant information and to identify and/or predict a root cause of a violation.

In instances in which an initial debug field does not lead to the identification and/or prediction of any root cause associated with the violation, the RCAF begins analysis of the next debug field value identified within the priority order and executes an analysis thereof as discussed above to determine whether a root cause may be identified based on the next identified debug field within the priority order. The process may continue with analysis of each subsequently identified debug field within the priority order until identification and/or prediction of a root cause for the violation.

The following example illustrates the operation of the RCAF.

Figure 7:
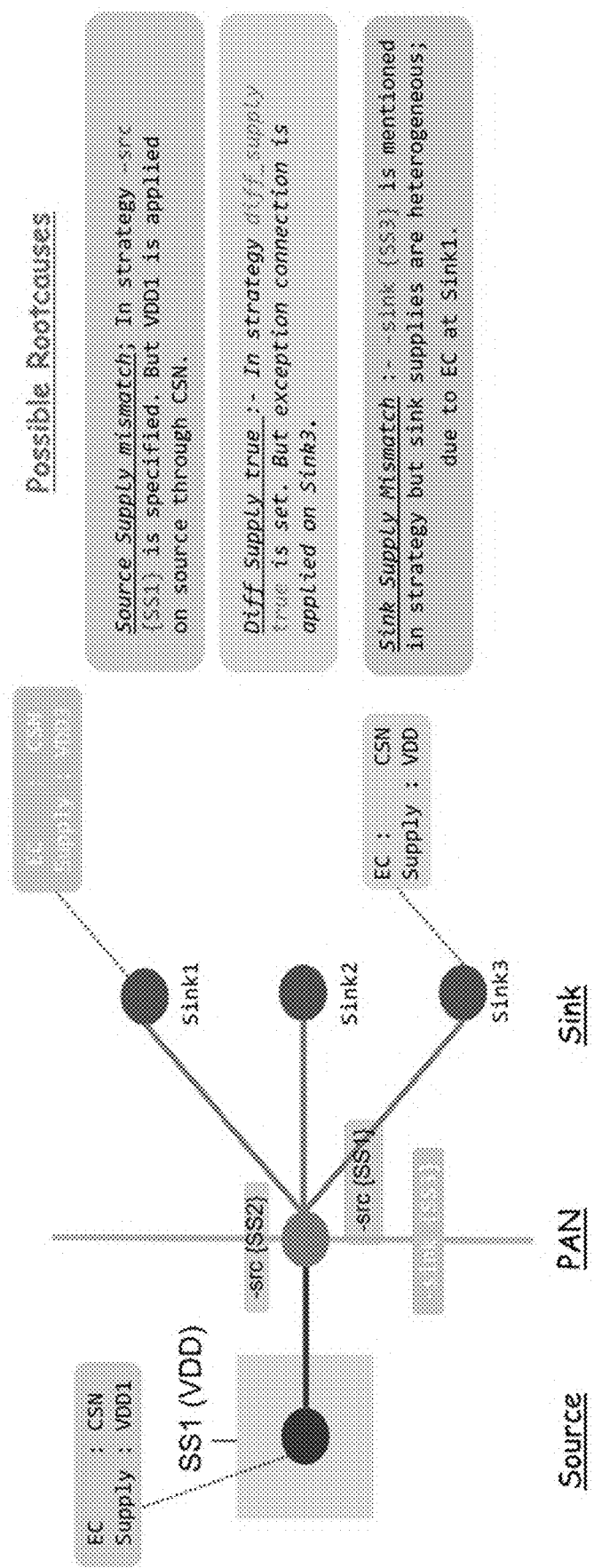
FIG. 7 illustrates the flow of an example low power violation tag called 'ISO_STRATEGY_MISSING'.

A low power violation tag called 'ISO_STRATEGY_MISSING' is chosen to demonstrate the flow. An example violation schematic is shown in FIG. 7.

An 'ISO_STRATEGY_MISSING' violation (as originally shown in FIG. 2) indicates that an isolation policy is required on crossing of the segment from segment source (Source) to segment sink (Sink) however, it is missing. There are various possible scenarios which can give rise to ISO_STRATEGY_MISSING violations. For example, A. Source Supply Mismatch: While specifying isolation policy (using set_isolation command) source supply (using switch-src to set_isolation command) has been specified as supply set SS1 having power supply VDD. Whereas, in the actual design an exception connection (using command connect_supply_net) has been applied on 'Source', which makes its power supply as VDD1. Thus, the policy has not been applied on the policy association node (PAN) and a violation ISO_STRATEGY_MISSING has been flagged.

B. Diff Supply True: In set_isolation command switch-diff_supply_only is set to true, which means the specified policy will only be applied where there is a difference in supply between source and sink. But in the original design an exception connection has been applied on sink 'Sink3' through connect_supply_net command. This has prevented the policy from being applied on the policy association node (PAN') and hence an ISO_STRATEGY_MISSING violation has been flagged.

C. Sink Supply Mismatch: In set_isolation command, switch-sink has been specified as SS3, which means an isolation policy will be attached with policy association nodes with segment sink supplies as SS3. But in the original design an exception connection VDD3 has been applied on sink 'Sink'', making the sink supplies heterogeneous. An ISO_STRATEGY_MISSING violation has been flagged for this reason.

Utilizing the RCAF to determine and/or predict the root cause of an ISO_STRATEGY_MISSING violation flagged due to 'source supply mismatch' condition (scenario A) may proceed in accordance with the following methodology.

Assume an ISO_STRATEGY_MISSING violation has been flagged with the following debug fields values,

| Violation Id | : 23 |
|---|---|
| Domain Boundary | : core1/out1 |
| Source Supply | : VDD1 |
| Sink Supply | : VDD2 |
| ... . | |

In certain embodiments, the RCAF executes the following processes for identifying and/or predicting root causes for the above violation.

1. (Debug field, Value) pairs are provided to an 'analysis layer' of the RCAF.
2. LP domain knowledge retrieved from the domain knowledge database to the 'analysis layer' indicates that 'domain boundary' is the highest priority debug field that is likely to lead to an identification and/or prediction of a root cause. Accordingly, the 'analysis layer' of the RCAF executes analysis beginning by querying the SIR with the string 'core1/out1'.
3. The RCAF searches the string 'core1/out1' in the component repositories of the SIR. The search yields a result from the Xover repository (FIG. 4) and the results are returned to the 'analysis layer' in the following form, (source mismatch, yes, CSN VDD1 applied)
(sink mismatch, no, NA)
(diff_supply_only, no, NA)

4. The 'analysis layer' of the RCAF parses the results and takes the next set action items as per one or more decisions specific to the violation report and/or debug field, such as the following decisions:
   a. sink mismatch? In the present circumstances, this decision results in a determination of "no," and thus, no further pruning required along this direction.
   b. diff_supply_only? In the present circumstances, this decision results in a determination of "no," and thus, no further pruning required along this direction.

c. source mismatch? In the present circumstances, this decision results in a determination of "yes," with a reason code→CSN VDD1 applied. The SIR data is further pruned based at least in part on this result, with irrelevant data to this analysis removed to facilitate further analysis with minimal computational resources.

5. The analysis layer thereafter searches the SIR with the string (core1/out1, VDD1). The search yields a result from parser repository as follows,

```
(command, connect_supply_net)
(file_name, top1.upf)
(line_no, 19)
```

Based on this result, the analysis layer of the RCAF queries the domain knowledge database and determines that no further analysis is possible. So, we have reached the end-point of root cause analysis.

6. In certain embodiments, the analysis layer collates information it has collected so far (e.g., all information collected, such as the output of the various analysis processes discussed above) in this analysis process. The analysis layer generates an abridged version of the analysis for the user that may be provided for display to the user. In this case the summary is,

```
Violation     : ISO_STRATEGY_MISSING
Id            : 23
   RootCause 1:
      Reason         : exception connection
      Command        : connect_supply_net
      File_name      : top1.upf
      Line_no        : 19
```

7. This summary will be passed to the user through an output layer (e.g., a display).

Figure 8:
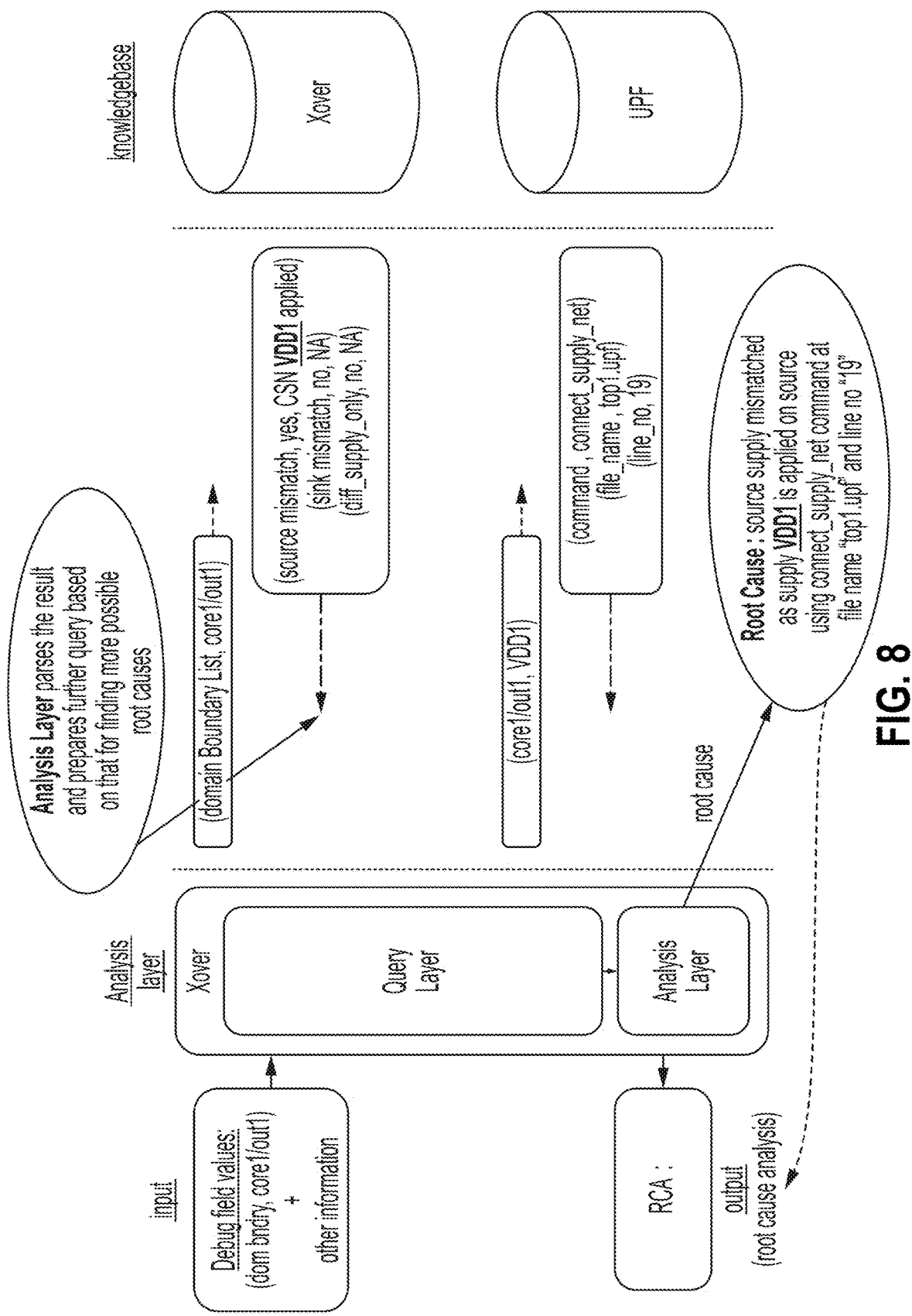
FIG. 8 illustrates the flow of one embodiment.

The flow described herein is summarized in FIG. 8.

DETAILED DESCRIPTION—TECHNOLOGY SUPPORT

General Computer Explanation

Figure 13A:
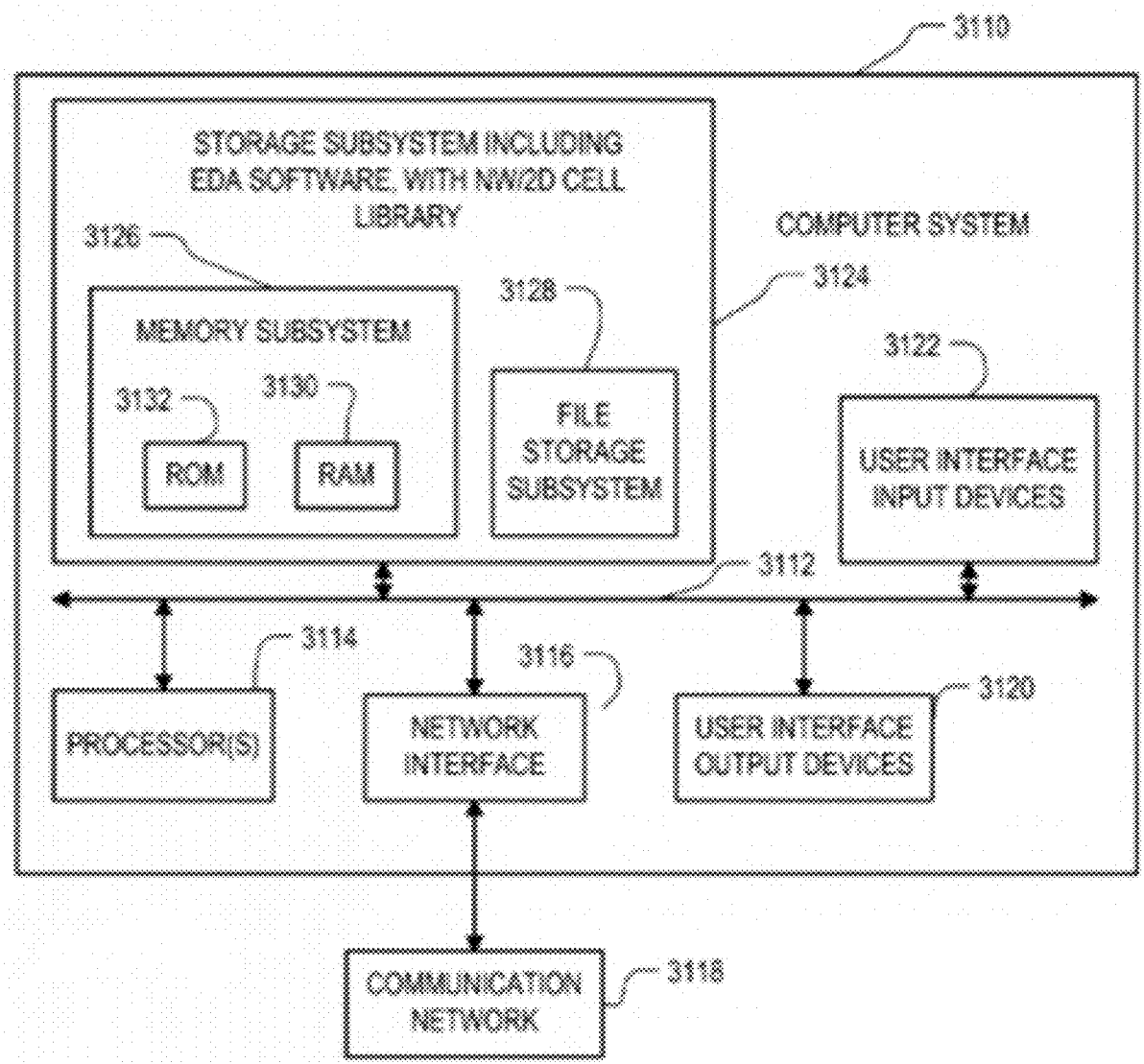
FIGS. 13A, 13B and 13C depict simplified block diagrams of a computer system suitable for use with embodiments of the technology, as well as circuit design and circuit embodiments of the technology.
Figures 13B, 13C:
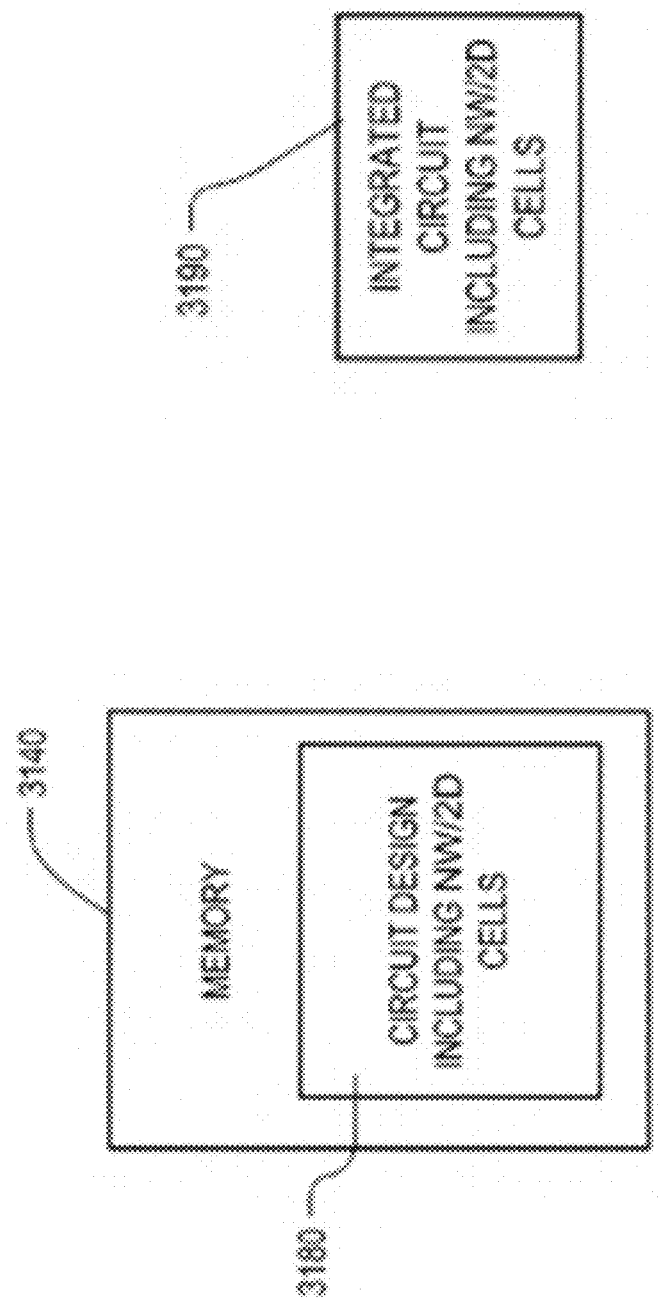

FIGS. 13A, 13B and 13C are simplified block diagrams of a computer system suitable for use with embodiments of the technology, as well as circuit design and circuit embodiments of the technology.

In FIG. 13A, computer system 3110 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array ('FPGA'). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 3110 depicted in FIG. 13A is intended only as one example for purposes of illustrating the preferred embodiments. Many other configurations of computer system 3110 are possible having more or less components than the computer system depicted in FIG. 13A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 3122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 3110 or onto communication network 3118. User interface input devices typically allow a user to select objects, icons, text and the like that appear on some types of user interface output devices, for example, a display subsystem.

User interface output devices 3120 may include a display subsystem, a printer, a fax machine, or non-visual displays such as audio output devices. The display subsystem may include a cathode ray tube (CRT), a flat panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 3110 to the user or to another machine or computer system.

Memory subsystem 3126 typically includes a number of memories including a main random-access memory ('RAM') 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access ('DMA') systems.

FIG. 13B depicts a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 13C signifies an integrated circuit 3190 created with the described technology that includes one or more cells selected, for example, from a cell library.

DETAILED DESCRIPTION—TECHNOLOGY SUPPORT

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs for example, sold by Xilink or Intel's Altera), Random Access Memories (RAMS) or microprocessors. A module is configured to process data and information, typically using a sequence of transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT

EDA System/Workflow Explanation

Figure 12:
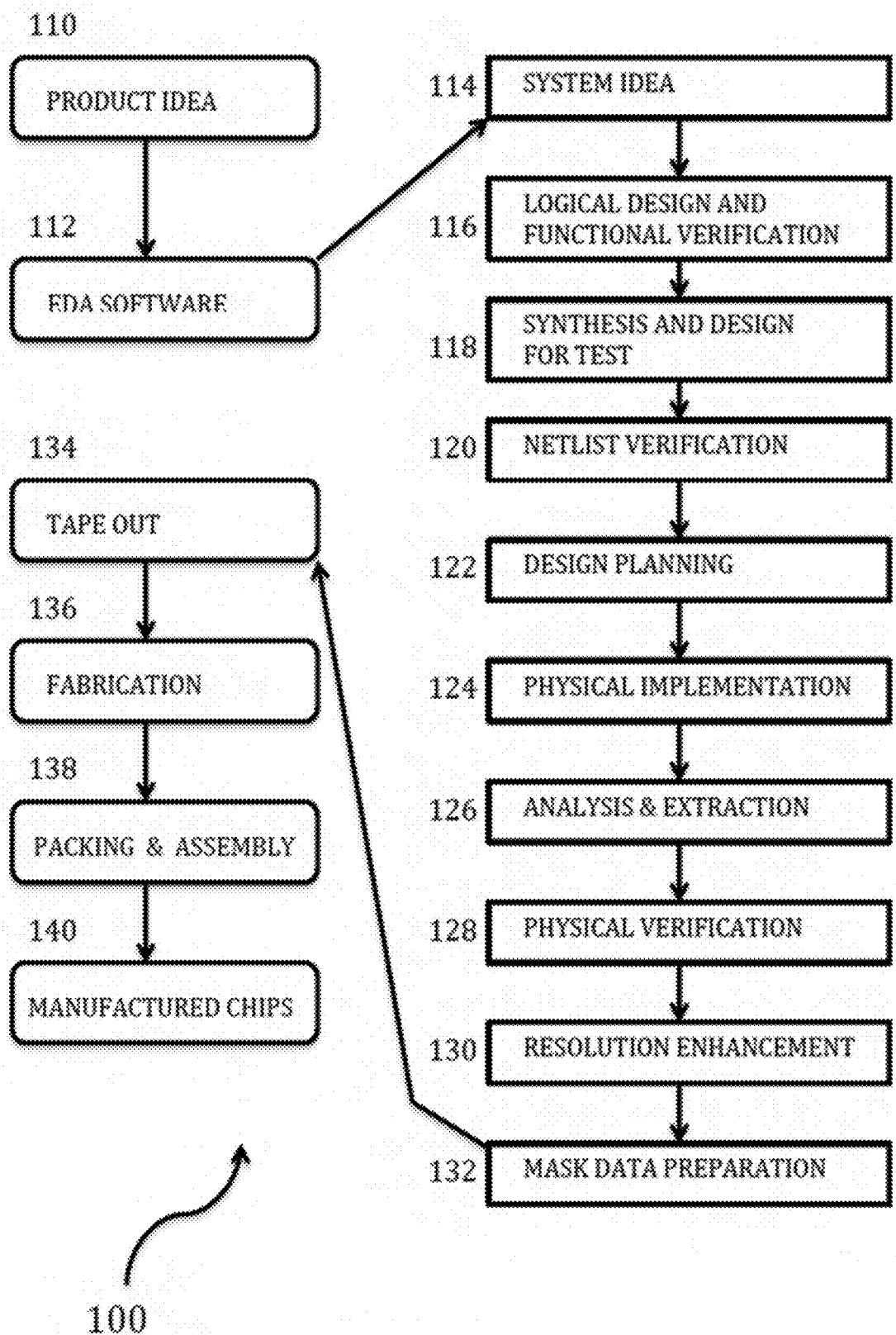
FIG. 12 depicts a flowchart of various operations in the design and fabrication of an integrated circuit in accordance with an embodiment of the present disclosure.

FIG. 12 illustrates various processes 30-100 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 30-110 with information supplied by a designer, information which is transformed during a process to create an item of manufacture (referred to herein as a design or device) that uses an EDA software tool 30-112, which may also be signified herein as EDA software, as a design tool, or a verification tool. When the design is finalized, it can be taped-out 30-134, which typically is when artwork (e.g., geometric patterns) for the integrated circuit is sent to a fabrication facility to manufacture the mask set, which is then used to manufacture the integrated circuit. After tape-out, a semiconductor die is fabricated 30-136 and packaging and assembly processes 30-138 are performed, which result in the finished integrated circuit 30-140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or Open Vera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 30-112 includes processes 30-114 to 30-132, which are described below. This design flow description is for illustration purposes only and is not meant to limit the present disclosure. For example, an actual integrated circuit design may require a designer to perform the design operations in a different sequence than the sequence described herein.

During system design 30-114, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 30-116, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (® signifies 'Registered Trademark').

During synthesis and design for test 30-118, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 30-120, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 30-122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 30-124, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 30-126, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 30-128, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 30-130, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 30-132, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 30-112.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—SEMANTIC SUPPORT

The signifier 'commercial solution' signifies, solely for the following paragraph, an engineering domain-specific (and thus non preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a 'PHOSITA', see MPEP 2141-2144} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with an enabling description either because insufficient guidance exists in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is 'difficult to understand' how to use in commerce any embodiment of the new commercial solution.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

That which is claimed:

1. A system for identifying a root cause of a static checker violation, the system comprising:
    a static information repository (SIR) configured for storing a plurality of databases in a hierarchical configuration, wherein:
        the plurality of databases contains data relevant to a design violation of a particular circuit design;
        the plurality of databases comprises a first database populated through execution of a diagnosis process by a first component of a static verification program, using a power intent specification of the circuit design as input; and
        the plurality of databases further comprises a second database populated through execution of a different diagnosis process by a second component of the static verification program, using the power intent specification of the circuit design as input; and
    one or more processing devices configured to:
        receive a violation report generated by the static verification program for the circuit design, wherein the violation report comprises a plurality of debug field values within corresponding debug fields;
        query a domain knowledge database to identify one or more debug fields as being relevant to identification of a root cause of the design violation;
        perform a query on the SIR, wherein the query on the SIR uses a debug field value associated with the one or more identified debug fields to search the plurality of databases, including the first database and the second database, sequentially based on an order defined by the hierarchical configuration;
        prune the plurality of databases such that data that was populated using the first component and which is irrelevant to identification of the root cause of the design violation is removed from further analysis, wherein the plurality of databases is pruned before or after the query on the SIR is performed; and
        identify the root cause of the design violation based on a result of the query on the SIR.

2. The system of claim 1, wherein at least one database of the plurality of databases is populated through parsing UPF commands in the power intent specification.

3. The system of claim 1, wherein pruning the plurality of databases comprises:
    querying each database of the plurality of databases to identify relevant data therein; and
    pruning one or more databases identified as not containing relevant information.

4. The system of claim 1, wherein:
    the hierarchical configuration is represented as a set of nodes, each node corresponding to a separate database;
    the query on the SIR comprises querying the plurality of databases in an order defined based on edges connecting nodes within the set of nodes; and the edges are assigned strength designations based on data within the domain knowledge database, each strength designation indicating an extent to which a database that a corresponding edge leads to is likely to contain data relevant to identification of the root cause of the design violation.

5. The system of claim 1, wherein the RCAF is further configured to generate an output identifying the root cause of the design violation.

6. The system of claim 1, wherein pruning the plurality of databases comprises:
receiving user input identifying data for pruning; and
pruning data identified within the user input.

7. A computer-implemented method for identifying a root-cause of a static checker violation, the method comprising:
populating a static information repository (SIR) embodied as a memory storage area with data relevant to a design violation of a particular circuit design, wherein the data is stored in a plurality of databases within the SIR, the plurality of databases being arranged in a hierarchical configuration and comprising a first database and a second database, and wherein:
the first database is populated through execution of a diagnosis process by a first component of a static verification program, using a power intent specification of the circuit design as input; and
the second database is populated through execution of a different diagnosis process by a second component of the static verification program, using the power intent specification of the circuit design as input;
receiving a violation report generated by the static verification program for the circuit design, wherein the violation report comprises a plurality of debug field values within corresponding debug fields;
querying a domain knowledge database to identify one or more debug fields as being relevant to identification of a root cause of the design violation;
perform a query on the SIR, wherein the query on the SIR uses a debug field value associated with the one or more identified debug fields to search the plurality of databases, including the first database and the second database, sequentially based on an order defined by the hierarchical configuration;
pruning the plurality of databases such that data that was populated using the first component and which is irrelevant to identification of the root cause of the design violation is removed from further analysis, wherein the plurality of databases is pruned before or after the query on the SIR is performed; and
identifying the root cause of the design violation based on a result of the query on the SIR.

8. The computer-implemented method of claim 7, wherein pruning the plurality of databases comprises:
querying each database of the plurality of databases to identify relevant data therein; and
pruning one or more databases identified as not containing relevant information.

9. The computer-implemented method of claim 7, wherein:
the hierarchical configuration is represented as a set of nodes, each node corresponding to a separate database;
the query on the SIR comprises querying the plurality of databases in an order defined based on edges connecting nodes within the set of nodes; and
the edges are assigned strength designations based on data within the domain knowledge database, each strength designation indicating an extent to which a database that a corresponding edge leads to is likely to contain data relevant to identification of the root cause of the design violation.

10. The computer-implemented method of claim 7, further comprising generating an output identifying the root cause of the design violation.

11. The computer-implemented method of claim 7, wherein pruning the plurality of databases comprises:
receiving user input identifying data for pruning; and
pruning data identified within the user input.

12. A non-transitory computer-readable storage medium comprising executable instructions configured to, when executed by a processor, cause the processor to:
populate a static information repository (SIR) embodied as a memory storage area with data relevant to a design violation of a particular circuit design, wherein the data is stored in a plurality of databases within the SIR, the plurality of databases being arranged in a hierarchical configuration and comprising a first database and a second database, and wherein:
the first database is populated through execution of a diagnosis process by a first component of a static verification program, using a power intent specification of the circuit design as input; and
the second database is populated through execution of a different diagnosis process by a second component of the static verification program, using the power intent specification of the circuit design as input;
receive a violation report generated by the static verification program for the circuit design, wherein the violation report comprises a plurality of debug field values within corresponding debug fields;
query a domain knowledge database to identify one or more debug fields as being relevant to identification of a root cause of the design violation;
perform a query on the SIR, wherein the query on the SIR uses a debug field value associated with the one or more identified debug fields to search the plurality of databases, including the first database and the second database, sequentially based on an order defined by the hierarchical configuration;
prune the plurality of databases such that data that was populated using the first component and which is irrelevant to identification of the root cause of the design violation is removed from further analysis, wherein the plurality of databases is pruned before or after the query on the SIR is performed; and
identify the root cause of the design violation based on a result of the query on the SIR.

13. The non-transitory computer readable medium of claim 12, wherein pruning the plurality of databases comprises:
querying each database of the plurality of databases to identify relevant data therein; and
pruning one or more databases identified as not containing relevant information.

14. The non-transitory computer readable medium of claim 12, wherein:
the hierarchical configuration is represented as a set of nodes, each node corresponding to a separate database;
the query on the SIR comprises querying the plurality of databases in an order defined based on edges connecting nodes within the set of nodes; and
the edges are assigned strength designations based on data within the domain knowledge database, each strength designation indicating an extent to which a database that a corresponding edge leads to is likely to contain data relevant to identification of the root cause of the design violation.

15. The non-transitory computer readable medium of claim 12, further comprising executable instructions configured to, when executed by the processor, cause the processor to generate an output identifying the root cause of the design violation.

16. The non-transitory computer readable medium of claim 12, wherein pruning the plurality of databases comprises:
   receiving user input identifying data for pruning; and
   pruning data identified within the user input.

17. The system of claim 1, wherein the one or more processing devices are configured to:
   prune the plurality of databases after performing the query on the SIR; and
   perform an updated query on the SIR using a search string comprising the debug field value associated with the one or more identified debug fields, wherein the search string further comprises a value from the result of the query on the SIR.

18. The system of claim 4, wherein the RCAF is further configured to:
   prune the plurality of databases by removing a database connected via an edge having a comparatively weaker strength designation.

19. The computer-implemented method of claim 9, further comprising:
   pruning the plurality of databases by removing a database connected via an edge having a comparatively weaker strength designation.

20. The non-transitory computer readable medium of claim 14, further comprising executable instructions configured to, when executed by the processor, cause the processor to:
   prune the plurality of databases by removing a database connected via an edge having a comparatively weaker strength designation.

* * * * *